(12) United States Patent
Yonezawa et al.

(10) Patent No.: US 11,590,569 B2
(45) Date of Patent: Feb. 28, 2023

(54) LOW-TEMPERATURE SINTERABLE COPPER PARTICLE AND METHOD FOR PRODUCING SINTERED BODY BY USING THE SAME

(71) Applicant: NATIONAL UNIVERSITY CORPORATION HOKKAIDO UNIVERSITY, Hokkaido (JP)

(72) Inventors: Tetsu Yonezawa, Hokkaido (JP); Hiroki Tsukamoto, Hokkaido (JP)

(73) Assignee: NATIONAL UNIVERSITY CORPORATION HOKKAIDO UNIVERSITY, Hokkaido (JP)

( * ) Notice: Subject to any disclaimer, the term of this patent is extended or adjusted under 35 U.S.C. 154(b) by 275 days.

(21) Appl. No.: 16/767,667

(22) PCT Filed: Nov. 29, 2017

(86) PCT No.: PCT/JP2017/042742
§ 371 (c)(1),
(2) Date: May 28, 2020

(87) PCT Pub. No.: WO2019/106739
PCT Pub. Date: Jun. 6, 2019

(65) Prior Publication Data
US 2020/0376546 A1    Dec. 3, 2020

(51) Int. Cl.
*B22F 1/16*    (2022.01)
*B22F 3/10*    (2006.01)
(Continued)

(52) U.S. Cl.
CPC ............... *B22F 1/16* (2022.01); *B22F 1/054* (2022.01); *B22F 3/10* (2013.01); *C09D 11/037* (2013.01);
(Continued)

(58) Field of Classification Search
CPC ......................................................... B22F 1/16
See application file for complete search history.

(56) References Cited

U.S. PATENT DOCUMENTS

2017/0043404 A1* 2/2017 Fukumoto ............... H01B 1/22

FOREIGN PATENT DOCUMENTS

| JP | 2016-69716 | 5/2016 |
| WO | 2016/031860 | 3/2016 |

OTHER PUBLICATIONS

International Search Report (ISR) dated Jan. 23, 2018 in International (PCT) Application No. PCT/JP2017/042742.

* cited by examiner

*Primary Examiner* — William D Young
(74) *Attorney, Agent, or Firm* — Wenderoth, Lind & Ponack, L.L.P.

(57) ABSTRACT

To provide novel low-temperature sinterable copper particles that can be sintered even at a low temperature of, for example, around 100° C. or less, and a method for producing a sintered body by using the same. The low-temperature sinterable copper particles according to the present invention are coated with a carboxylic acid, and a surface of the copper particle is oxidized so as to have a cuprous oxide fraction ($Cu_2O/(Cu+Cu_2O)$) in the copper particle of 4% by mass or less or so as to have an average coating thickness of cuprous oxide of 10 nm or less. The low-temperature sinterable copper particles are subjected to low-temperature firing in an atmosphere of 0.01 Pa or less.

9 Claims, 10 Drawing Sheets

Sample 1
Surface oxide film: around 0.5 nm

Sample 2
Surface oxide film: around 6 nm

Sample 3
Surface oxide film: around 6 nm

Sample 4
Surface oxide film: around 16 nm

(51) Int. Cl.
*C09D 11/037* (2014.01)
*C09D 11/322* (2014.01)
*C09D 11/52* (2014.01)
*B22F 1/054* (2022.01)

(52) U.S. Cl.
CPC ............ C09D 11/322 (2013.01); C09D 11/52 (2013.01); *B22F 2301/10* (2013.01); *B22F 2304/058* (2013.01)

Water droplet

Caproic acid-coated copper particle

LOW-TEMPERATURE SINTERABLE COPPER PARTICLE AND METHOD FOR PRODUCING SINTERED BODY BY USING THE SAME

TECHNICAL FIELD

The present invention relates to copper particles which can be sintered at a low-temperature, and a method for producing a sintered body by using the same.

BACKGROUND ART

In recent years, a technique called "printable electronics", which directly forms micron-class fine wiring by inkjet or a printing method using conductive ink containing metal particles, has been receiving attention as an environmental friendly technique that does not require the exposure and etching used in conventional production of printed boards and does not emit harmful chemical substances.

A film of conductive ink prepared by printing or the like has extremely low electrical conductivity because it is aggregates of independent metal particles in the state as it is. Therefore, the metal particles are subjected to heat treatment to form a sintered body, and as a result of which the electric conductivity is obtained. Conventionally, from the viewpoint of the heat resistance of a substrate and the like, sintering at a low temperature, for example, less than 250 to 350° C. has been required, but recently, in particular, in order to apply a low-melting point material, which is inexpensive and has high supplying ability, to a flexible substrate or the like, it has been desired to form a sintered body by heat treatment at a lower temperature such as 100° C., or in addition to this, to form a sintered body in a short time of around 15 minutes in the application to a die bonding material.

In the present situation, silver, which can be sintered at a low temperature of around 150° C., is frequently used for printable electronics and a die bonding material.

However, since silver is expensive and there is a concern about the effect of a wiring short circuit due to ion migration, copper, which has a function equivalent to that of silver, is inexpensive, and has high ion-migration resistance, has been attracting attention.

But copper has a problem that when formed into fine particles, copper is easily oxidized, and high-density sintering cannot be performed at a low temperature, and thus copper has not yet been put into practical use. The introduction of an organic protective agent for preventing the oxidation makes the low-temperature sintering even more difficult since the organic protective agent itself does not decompose at a low temperature.

In contrast, the present inventors, have developed a technique to achieve low-temperature sintering at 200° C. or lower by a two-step sintering method (Patent Literature 1), and introduction of copper complex ink (Patent Literature 2).

As another approach separately from the above, a vacuum sintering method has been proposed (Non Patent Literature 1). In this method, copper particles coated with an alkylamine-based organic protective agent are preheated in air without pressurization or under a vacuum about 0.1 Pa, and then the preheated copper particles are again heated to 250-400° C. The oxidation states of the surfaces of the copper particles have been analyzed by Fourier transform infrared spectroscopy (FT-IR), and it has been reported that the sintering characteristics of the copper particles oxidized by performing the preheating step in the air are deteriorated.

In Patent Literature 3, a coated copper particle coated with an aliphatic carboxylic acid having an aliphatic group with 5 or more carbon atoms and having a size in a specific range, has been proposed. Patent Literature 3 discloses that by using copper formate as a starting material and allowing to proceed the thermal decomposition reduction reaction of a copper formate complex in a liquid phase, the formation of copper oxide is suppressed in the thermal decomposition treatment of the copper formate complex, the physical adsorption of the aliphatic carboxylic acid is promoted, and a copper particle free of cuprous oxide and copper oxide is produced. Patent Literature 3 also discloses that by using the copper particle, sintering is performed at 300° C.

CITATION LIST

Patent Literature

Patent Literature 1: JP 2015-214722 A
Patent Literature 2: JP 2017-1978 A
Patent Literature 3: JP 2016-176146 A (JP 6033485 B2)

Non Patent Literature

Non Patent Literature 1: J. Electron. Mater., 42(6) (2013) 1260-1267

SUMMARY OF INVENTION

Technical Problem

However, in a conventional technique, there are many conditional restrictions are applicable. For example, because it is difficult to form a sintered body at 150° C. or less, it is required to introduce an inert gas or a reducing gas in order to prevent the oxidation of copper particle, and further, in a case where such a gas is introduced, it requires more time to remove residual oxygen from the atmosphere and to replace that with the gas. Further, among conventional techniques, even in the technique disclosed in Patent Literature 2, which is capable of performing sintering at 100° C., sintering time of about one hour is required. In addition, as the characteristics of the conventional technique, it is required that the copper particle used for sintering is not oxidized, or that in a case where the copper particle is oxidized, the re-reduction is performed, and further, there is a restriction on the storage of the copper particle.

The present invention is made in consideration of the above circumstances, and aims to provide a novel low-temperature sinterable copper particles and a manufacturing method of sintered bodies using them, which can be easily sintered in a short time even at low temperatures below about 100° C., for example, and which can be sintered even against minor oxidation of copper particles.

Solution to Problem

As a result of intensive studies to solve the problems described above, the present inventors have found that by using copper particles each of which is coated with an aliphatic monocarboxylic acid having 5 or more carbon atoms and the surface of the copper particle is oxidized with cuprous oxide ($Cu_2O$) having an appropriate ratio or coating thickness, when the copper particle is sintered under the condition of from a high vacuum of 0.01 Pa or less to an ultrahigh vacuum, a sintering phenomenon is generated at a lower temperature than before, particularly even at an extremely low temperature of 100° C. or less, without depending on the size of the copper particles, and thus have completed the present invention.

That is, the low-temperature sinterable copper particles according to the present invention is characterized in that each copper particle is coated with a carboxylic acid, and a surface of the copper particle is oxidized so as to have a cuprous oxide fraction ($Cu_2O/(Cu+Cu_2O)$) in the copper particle of 4% by mass or less or so as to have an average coating thickness of cuprous oxide of 10 nm or less.

The method for producing a low-temperature sinterable copper particles according to the present invention is characterized in that the low-temperature sinterable copper particles are subjected to low-temperature firing in an atmosphere of 0.01 Pa or less.

Advantageous Effects of Invention

According to the present invention, when the sintering is performed under the condition of from a high vacuum of 0.01 Pa or less to an ultrahigh vacuum, the sintering can be performed even at a low temperature of, for example, around 100° C. or less.

Further, it is possible to perform the sintering at a low temperature by using a copper particle having a size in a wide range without being particularly dependent even on the size of the copper particle.

Therefore, a material suitable for printable electronics that directly forms micron-class fine wiring by inkjet or a printing method is provided.

DESCRIPTION OF EMBODIMENTS

Figure 1:
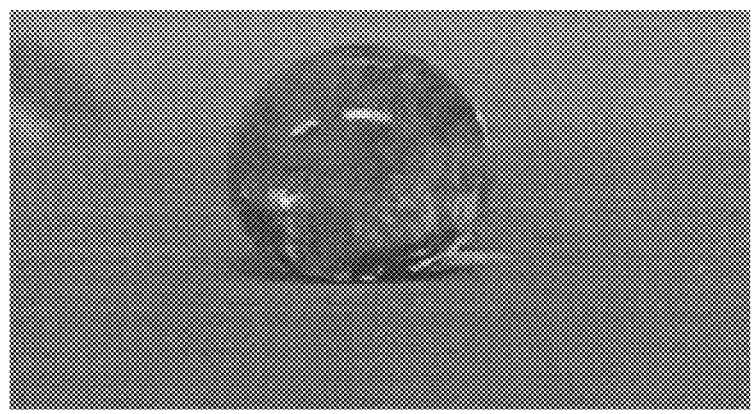
FIG. 1 is a photograph showing a state of a drop of water dropped on a powder surface of the caproic acid-coated copper particle formed in Examples. The powder has extremely high hydrophobicity and the contact angle of the water droplet is large.

Hereinafter, the present invention will be described in detail.

In the present invention, the expression "low-temperature sintering" means that sintering of copper particles are performed at 150° C. or less, preferably 120° C. or less, and most preferably 100° C. or less. The lower limit of the temperature is not particularly limited as long as the sintering can be performed by using the low-temperature sinterable copper particles according to the present invention, and the lower the limit is, the better the temperature is.

The low-temperature sinterable copper particle according to the present invention is coated with a carboxylic acid, and further, a surface of the copper particle is oxidized to be cuprous oxide.

Examples of the carboxylic acid include a saturated fatty acid, an unsaturated fatty acid, a hydroxy acid, an aromatic carboxylic acid, and a terpene-based carboxylic acid. In particular, the carboxylic acid is preferably at least one kind selected from an aliphatic monocarboxylic acid, an aliphatic dicarboxylic acid, an aromatic carboxylic acid, and a terpene-based carboxylic acid.

From the viewpoint of being suitable for a copper particle for sintering, which tends to exhibit hydrophobicity, and becomes active during the firing and inactive during the storage, the aliphatic monocarboxylic acid is preferred to have 5 or more carbon atoms. The aliphatic monocarboxylic acid may be either a linear chain or a branched chain, and may be either a saturated aliphatic monocarboxylic acid or an unsaturated aliphatic monocarboxylic acid. Among them, a linear-chain saturated aliphatic monocarboxylic acid is preferred. Further, the aliphatic monocarboxylic acid preferably has 5 to 18 carbon atoms. The aliphatic monocarboxylic acid may be used singly alone or in combination of two or more kinds thereof. As the aliphatic monocarboxylic acid, caproic acid (6), caprylic acid (8), capric acid (10), lauric acid (12), myristic acid (14), palmitic acid (16), stearic acid (18), or the like, which has an even number of carbon atoms, is suitable because of being inexpensive and easy to obtain.

Aliphatic dicarboxylic acid is preferred to have a carbon number of 6 or more because it tends to show hydrophobicity and is suitable for sintering copper particles that become active during sintering and inert during storage. The aliphatic dicarboxylic acid may be either a linear-chain or a branched chain, and may be either a saturated aliphatic dicarboxylic acid or an unsaturated aliphatic dicarboxylic acid. Among these, a linear-chain saturated aliphatic dicarboxylic acid is preferred. Further, the aliphatic dicarboxylic acid preferably has 6 to 18 carbon atoms. The aliphatic dicarboxylic acid may be used either singly alone or in combination of two or more kinds thereof. Specific examples of the aliphatic dicarboxylic acid include adipic acid, pimelic acid, suberic acid, azelaic acid, sebacic acid, 1,9-nonane dicarboxylic acid, 1,10-decane dicarboxylic acid, brasylic acid, 1,12-dodecane dicarboxylic acid, 1,13-tridecane dicarboxylic acid, thapsic acid, 1,15-pentadecane dicarboxylic acid, and 1,16-hexadecane dicarboxylic acid.

Specific examples of the aromatic carboxylic acid include benzoic acid, phthalic acid, isophthalic acid, terephthalic acid, hemimellitic acid, trimellitic acid, and trimesic acid.

As the terpene-based carboxylic acid, a terpene-based carboxylic acid contained in rosin or the like can be used. Specific examples of the terpene-based carboxylic acid include abietic acid, neoabietic acid, palustric acid, pimaric acid, isopimaric acid, and desidroabietic acid.

The low-temperature sinterable copper particles of the present invention have their surfaces oxidized so that the copper oxide fraction (Cu2O/(Cu+Cu2O)) in the copper particles is less than or equal to 4 mass % or the average coating thickness of the copper oxide is 10 nm or less. When the cuprous oxide fraction in the copper particles and the average coating thickness of cuprous oxide are within the ranges described above, by performing the sintering under the condition of from a high vacuum such as 0.01 Pa or less to an ultrahigh vacuum, the low-temperature sinterable copper particles can be sintered at 100° C. or less under the low-temperature condition as described above, among them, in a particularly preferred embodiment. If the cuprous oxide fraction in the copper particles is extremely large due to excessive oxidation or if the film of cuprous oxide is extremely thick, the low-temperature sinterable copper particles cannot be sintered under such a condition. It is preferable that the surface of the copper particle is oxidized so that the cuprous oxide fraction in the copper particle ($Cu_2O/(Cu+Cu_2O)$) is 4% by mass or less, and the average coating thickness of cuprous oxide is 10 nm or less.

From the viewpoint of being suitable for performing the sintering at a low temperature by performing the firing under the condition of from a high vacuum to an ultrahigh vacuum, the cuprous oxide fraction in the copper particle is preferably 1 to 4% by mass.

The average coating thickness of copper oxide is preferably 0.3 to 10 nm because it is suitable for sintering at low temperatures by sintering in high to ultra-high vacuum conditions. In the present invention, the average coating thickness of cuprous oxide can be determined as the average value obtained by measuring a coating thickness at any position of at least one or more copper particles by photographic observation of a cuprous oxide coated film with a TEM (transmission electron microscope).

As to the surface of the copper particle, by a method of natural oxidation due to exposure to or flow of air or oxygen, air heating, or the like, copper particles having different degrees of the surface oxidation can be formed.

The low-temperature sinterable copper particle according to the present invention is formed by using a carboxylic acid such as a hydrophobic aliphatic monocarboxylic acid as an organic protective agent. A carboxylic acid is a typical material used for soldering flux or the like, and the following chemical reaction [1] or [2] occurs at the time of heating.

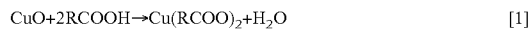

$$CuO+2RCOOH \rightarrow Cu(RCOO)_2+H_2O \quad [1]$$

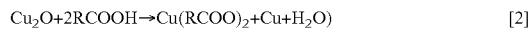

$$Cu_2O+2RCOOH \rightarrow Cu(RCOO)_2+Cu+H_2O) \quad [2]$$

(R represents an alkyl group)

Such a reaction removes an oxide on a surface of a copper particle, and in the cleaning process, the surface of the copper particle becomes highly active and enhances the sinterability. In the reaction, a copper oxide and a carboxylic acid are required, and it is important to dare to appropriately oxidize the particle surface in order to increase the reactivity.

The surface oxide can be formed by a simple technique such as preheating in the air, and a coated film of a carboxylic acid such as a hydrophobic aliphatic monocarboxylic acid having 5 or more carbon atoms also plays a role of suppressing further oxidation over time and of maintaining the appropriate oxidation state. Although the details of the phenomenon have not been elucidated, since 70% of the residual gas in the initial stage of evacuation in a firing step is derived from water, it is considered that the effect of the water adsorbed on copper particle is significant. The surface of the copper particles is exposed due to the desorption of adsorbed water in a high vacuum, and the activation of the copper surface is simultaneously generated due to the fluxing action of carboxylic acid, and as a result of which sintering at a low temperature is promoted.

In a case where water is present at the same time, the equilibrium reaction of $RCOOH+H_2O \Leftrightarrow RCOO^-+H_3O^+$ (R represents an alkyl group) occurs, and the carboxylic acid used for an organic protective agent acts as a weak acid, and causes the corrosion reaction to proceed, and therefore, the carboxylic acid is desirably a hydrophobic carboxylic acid.

The low-temperature sinterable copper particles according to the present invention is not particularly limited in terms of the shape of the particle, and examples of the shape of the particle include a spherical shape, an ellipsoidal shape, a polyhedral shape (such as a polygonal pyramid shape, a cubic shape, or a rectangular parallelepiped shape), a plate shape, a rod shape, and an irregular shape. Among them, an isotropic shape such as a substantially spherical shape is preferred from the viewpoint of being excellent in the dispersibility and the like.

The low-temperature sinterable copper particles according to the present invention have an average particle diameter of preferably 20 to 800 nm, and more preferably 70 to 360 nm. In the present invention, the average particle diameter of copper particles is a primary particle diameter, and means a median diameter by the counting in an observation image with a scanning electron microscope (SEM). Further, in a case where the particle shape is not a spherical shape, the median value calculated on the basis of the area equivalent circle diameter of particles is defined as the particle diameter.

If the average particle diameter is within the range as described above, the cohesive force between copper particles is reduced due to the moderately large particle diameter, and thus the copper particles are easily dispersed in a solvent. In addition, the content of an organic component that is attributed to an organic protective agent and functions as an insulator can be reduced, and the conductivity of a conductive film is improved. Further, unnecessarily excessive surface oxidation due to the increase in the surface area can also be suppressed. On the other hand, when the particle diameter is adequately small, a conductive film having a uniform surface is easily obtained, and not only the volume resistivity of the conductive film is reduced, but also the high-speed transmission is improved. This phenomenon is attributed to the surface effect. That is, since current concentration occurs on a conductor surface in a case of high-frequency signals, if the surface of a conductive film is rough, the transmission path extends and the loss is increased. By reducing the particle diameter of the copper particles constituting the conductive film, the surface roughness is reduced, and the uniformity of the conductive film is easily ensured.

In a case where the average particle diameter is within the range as described above, the low-temperature sinterable copper particles according to the present invention can be sintered at 100° C. or less under the low-temperature condition described above, among them, in a particularly preferred embodiment, by performing the firing under the condition of from a high vacuum such as 0.01 Pa or less to an ultrahigh vacuum, without depending on the size of the copper particles.

The method for producing a low-temperature sinterable copper particle according to the present invention is not particularly limited, and examples of the method include a gas phase method (such as a sputtering method, an evaporation method, or a plasma method), and a liquid phase method (such as a chemical reduction method, a heating decomposition method, or a polyol method). In a case of performing surface modification by an organic protective agent, a liquid phase method is suitable, and in the present invention, a chemical reduction method, by which synthesis can be easily performed at a low temperature of around 70° C., is used.

In a case where the low-temperature sinterable copper particles according to the present invention is produced by a chemical reduction method, a copper compound is dispersed or dissolved in a solvent, the carboxylic acid being an organic protective agent and a reducing agent are added into the solvent, and the resultant mixture is reacted under the condition in which a reduction reaction proceeds, such as a condition of temperature rise, and the copper particle coated with the carboxylic acid is formed.

As the solvent, lower alcohols such as methanol, ethanol, and 2-propanol, which have relatively low polarity to water, or a ketone such as acetone can be used. These may be used singly alone or in combination of two or more kinds thereof.

As the copper compound, an anhydride or hydrate of copper oxide (CuO), cuprous oxide ($Cu_2O$), copper hydroxide ($Cu(OH)_2$) or the like, which is dispersed as particles in a solvent, or copper formate ($Cu(HCOO)_2$), copper acetate ($Cu(CH3COO)_2$), copper sulfate ($CuSO_4$) or the like, which is partially or all dissolved in a solvent and serves for reduction in the state of a copper ion solution, can be used.

From the viewpoint of the productivity of the copper particles, the suppression of increase in viscosity of a reaction mixture, or the like, the amount of the copper compound to be added is not particularly limited, depending on the kind of the copper compound, and the copper compound is added so that the concentration of copper ions is preferably 0.01 to 5 mol/L, and more preferably 0.1 to 3 mol/L.

From the viewpoint of controlling the diameter of the copper particles to be formed, the amount of the carboxylic acid being an organic protective agent to be added varies depending on the chain length or the like, and is, for example, preferably in the range of 0.0001 to 4 equivalents, and more preferably in the range of 0.002 to 0.1 equivalent, to the copper ions in a reaction mixture.

Examples of the reducing agent include a hydrazine-based reducing agent such as hydrazine, hydrazine hydrochloride, hydrazine sulfate, or hydrazine hydrate, a borohydride such as sodium borohydride, citric acid, and ascorbic acids. The amount of the reducing agent to be added may be stoichiometrically determined in consideration of the reaction with the copper compound.

By heating a solvent in which a copper compound is dispersed or dissolved, metal nuclei a copper particle is reduced from the copper compound, and a copper particle coated with the above-described carboxylic acid that is an organic protective agent is formed.

After completion of the reaction, the copper particles each coated with carboxylic acid are washed and purified with an organic solvent or the like, and then the resultant copper particles may be appropriately subjected to the separation, the drying, and the like.

As to the surface of the copper particle, by a method of natural oxidation due to exposure to or flow of air or oxygen, air heating, or the like, copper particles having different degrees of the surface oxidation can be formed.

By firing the low-temperature sinterable copper particles according to the present invention under the condition of from a high vacuum of 0.01 Pa or less to an ultrahigh vacuum, the low-temperature sinterable copper particles can be sintered at 100° C. or less under the low-temperature condition as described above, among them, in a particularly preferred embodiment, without depending on the particle diameter. Although the detailed reasons of the phenomenon have not been elucidated, since 70% of the residual gas in the initial stage of evacuation is derived from water, it is considered that the effect of the water adsorbed on the copper particle is significant. That is, it is considered that exposure of the surface of the copper particle due to the desorption of adsorbed water in a high vacuum, and purification of the copper surface due to the fluxing action of carboxylic acid are simultaneously generated, and as a result of which sintering at a low temperature is promoted.

The sintering can be performed by exposing the low-temperature sinterable copper particles according to the present invention to an atmosphere of 0.01 Pa or less, and the lower the pressure is, the better the sintering is. The lower limit is not particularly limited, and is preferably $1 \times 10^{-4}$ Pa or more from the viewpoint that the condition can be changed from a high vacuum to an ultrahigh vacuum without using a special vacuum evacuation device.

As to the configuration for realizing a space of from a high vacuum of 0.01 Pa or less to an ultrahigh vacuum, a vacuum evacuation device connected to a vacuum chamber or the like that houses the low-temperature sinterable copper particles according to the present invention can be employed. A large-scale vacuum evacuation device is not necessarily required, and the space of from a high vacuum of 0.01 Pa or less to an ultrahigh vacuum can be easily realized by an evacuation system using a small-sized turbo molecular pump.

The composition of a gas component under from a high vacuum to an ultrahigh vacuum is not particularly limited, and the firing can be performed under the condition of evacuation with a vacuum evacuation device.

The sintering temperature is 150° C. or less, preferably 120° C. or less, and most preferably 100° C. or less. The lower limit of the temperature is not particularly limited as long as the sintering can be performed by using the low-temperature sinterable copper particles according to the present invention, and the lower the limit is, the better the temperature is.

The sintering time, that is, the heating time of the low-temperature sinterable copper particle according to the present invention is appropriately adjusted depending on the film thickness, the firing temperature and the like in a case where a film of the copper particle is formed, and the firing time can be, for example, around 60 minutes, and is preferably 15 minutes or less from the viewpoint of the productivity or the like.

In an evacuation system such as a vacuum chamber, a means for the placement or fixation of the low-temperature sinterable copper particles according to the present invention or a substrate or the like to which the low-temperature sinterable copper particles are imparted in the form of a film or the like, such as a holder, is installed. It is preferable that the means for the placement or fixation of low temperature sinterable copper particles is connected to a heating device such as a heater that can control the heating temperature, and the said means be heated or the low-temperature sinterable copper particles according to the present invention are directly heated by the irradiation with visible light, near infrared light or the like from the outside through a quartz viewport or the like so as to obtain a desired temperature, and further the means for the placement or fixing has a cooling means such as a thermoelectric element, or a cooling water supply device so as to perform the cooling rapidly even in a vacuum insulation system.

When sintering the low-temperature sinterable copper particles according to the present invention, the form of an aggregate of copper particles of the present invention is not particularly limited, and may be a form of a film, a lump, or the like depending on the shape of the desired sintered body, but a film is preferred from the viewpoint of the application to various fields as a conductor. For example, by using a dispersion in which the low-temperature sinterable copper particles according to the present invention are dispersed in a dispersing medium, or dry powder, the low-temperature sinterable copper particles are formed into a film by imparting the copper particles to a substrate by means of coating or the like.

In a case where a dispersion in which the low-temperature sinterable copper particles according to the present invention are dispersed in a dispering medium is used, as the dispersing medium, an organic solvent is preferably used from the viewpoint that it is easy to use as a conductive paste or conductive ink containing a high concentration of copper particles and the dispersibility is favorable. Examples of the organic solvents include an alcohol-based solvent such as an alkanol, an aliphatic polyhydric alcohol, or an alicyclic alcohol, an ester-based solvent such as an acetic ester, a ketone-based solvent such as a chain ketone, or a cyclic ketone, an ether-based solvent such as a chain ether, or a cyclic ether, an aromatic solvent such as an aromatic hydrocarbon, a halogen-based solvent such as a haloalkane, a nitrile-based solvent, and a nitro-based solvent. These may be used singly alone or in combination of two or more kinds thereof. As the dispersing medium for screen printing, high-viscosity polyhydric alcohols such as ethylene glycol, propylene glycol, and glycerin can be mainly used, and as the dispersion medium for inkjet printing, a low-viscosity lower alcohol such as methanol, ethanol, or 2-propanol can be mainly used.

From the viewpoint of forming a highly conductive sintered film or the viewpoint of the applicability of a dispersion, the solid content concentration of the low-temperature sinterable copper particles according to the present invention in a dispersion can be, for example, 30 to 90% by mass, and particularly 50 to 80% by mass.

The dispersion may contain additive agents that are usually added to a conductive paste or a conductive ink, depending on the application. Examples of the additive agents include coupling agents, dispersants, coloring agents, hue improvers, dye fixing agents, and gloss imparting agents.

As the substrate, an organic material or an inorganic material can be used. Examples of the organic material include a polymethyl methacrylate-based resin, a polypropylene-based resin, a cyclic polyolefin-based resin, a styrene-based resin, a vinyl chloride-based resin, a polyester-based resin, a polyamide-based resin, a polycarbonate-based resin, a polysulfone-based resin, a polyethersulfone-based resin, a polyimide-based resin, a cellulose derivative, a fluorine resin, a phenol resin, and an epoxy resin. Examples of the inorganic material include glasses such as soda glass, borosilicate glass, crown glass, barium-containing glass, strontium-containing glass, boron-containing glass, low alkali glass, alkali-free glass, crystallized transparent glass, silica glass, quartz glass, and heat-resistant glass, and a metal oxide such as alumina, sapphire, zirconia, titania, yttrium oxide, an indium oxide-tin oxide-based complex oxide (ITO), a fluorine-doped tin oxide (FTO), or an antimony-doped zinc oxide (AZO). These may be used singly alone or as a composite material in combination of two or more kinds thereof. The thickness of the substrate is not particularly limited as long as the heating means is a heating means by the irradiation with visible light, near infrared light or the like, which can directly heat the low-temperature sinterable copper particles, and in a case where the heating is performed through a substrate with a heater or the like, the thickness of the substrate varies depending on the thermal conductivity of the material, and is preferably, for example, within several mm.

By sintering the low-temperature sinterable copper particles according to the present invention under the condition of from a high vacuum of 0.01 Pa or less to an ultrahigh vacuum, a sintered body can be obtained at 100° C. or less under the low-temperature condition as described above, among them, in a particularly preferred embodiment, without depending on the particle diameter, and therefore, even if the substrate is a substrate having low heat resistance, such as a polymethyl methacrylate-based resin, a cyclic polyolefin-based resin, a styrene-based resin, a vinyl chloride-based resin, a polyester-based resin, a polycarbonate-based resin, a cellulose derivative, a phenol resin, or an epoxy resin, the low-temperature sinterable copper particles according to the present invention can be fired by subjecting the entire substrate applied with the copper particles to heat treatment.

As the method for applying a dispersion containing the low-temperature sinterable copper particles according to the present invention, a conventional method can be used, and in a case of forming a pattern such as wiring, for example, a screen printing method, an inkjet printing method, an intaglio printing method, an offset printing method, an intaglio offset printing method, a letterpress printing method, a flexographic printing method, reverse printing, or the like can be used. The wiring pattern can be formed, for example, by applying a dispersion containing the low-temperature sinterable copper particles according to the present invention onto a substrate so as to form a desired pattern, and by subjecting the resultant substrate applied with the copper particles to heat treatment under the above-described conditions of from a high vacuum to an ultrahigh vacuum and of a low temperature.

The thickness of the coating film is not particularly limited, and is, for example, 1 to 100 μm.

A conductive film sintered with the low-temperature sinterable copper particles according to the present invention can be used, for example, as a material for forming a circuit of a printed board (particularly, flexible substrate) and other fine wiring materials, and further as a die bonding material for a power semiconductor in application of heat conduction. Further, it can also be used as an antistatic material, an electromagnetic wave shielding material, an infrared shielding material, or the like.

EXAMPLES

Hereinafter, the present invention will be further described in more detail by way of Examples, however, the present invention is not limited to these Examples.

1. Formation of Carboxylic Acid-Coated Copper Particle

By using a 1-L flask, carboxylic acid-coated copper particles were formed on the basis of the following technique. Into 0.1 mol of a raw material copper oxide (CuO, manufactured by Nisshin Chemco LTD.), 100 mL of a solvent alcohol (2-propanol or ethanol) was poured, into the obtained mixture, caproic acid was added in the range of 2 to 6 mmol while sufficiently stirring the mixture with a stirring blade, and the resultant mixture was heated up to 70° C. in a water bath, and then 0.2 mol of hydrazine monohydrate was added into the mixture and the reaction was conducted for 1 to 2 hours. After the reaction, the mixture was cooled to room temperature, and then the cooled mixture was centrifuged to remove the supernatant, and then a similar operation was performed by using a solvent such as ethanol, acetone, or methanol to purify copper particles. In the end, the copper particles were sufficiently dried with a nitrogen flow to recover the copper particles as powder.

Figure 2:
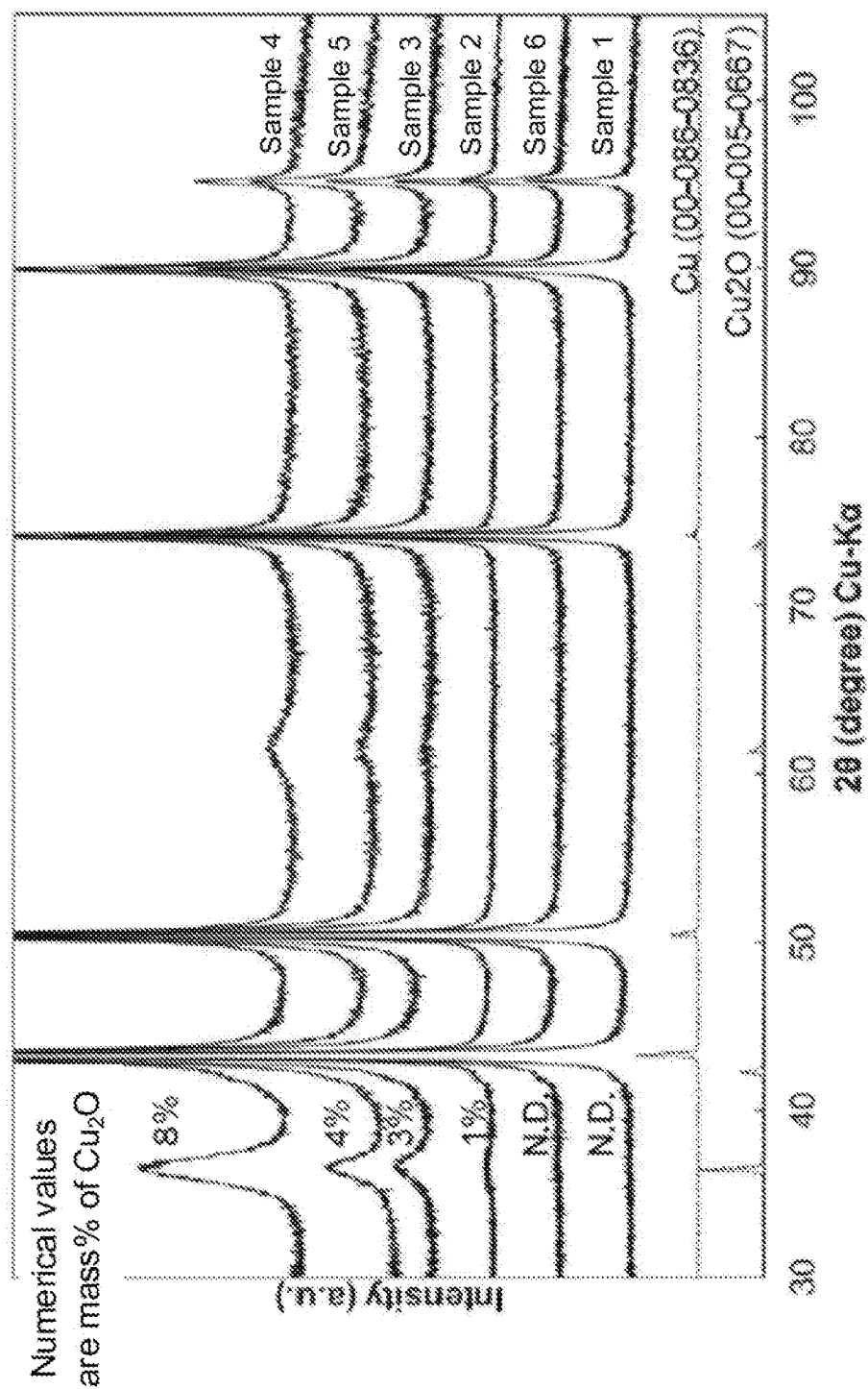
FIG. 2 is a chart showing the results obtained by performing sintering experiments on respective samples having different degrees of the surface oxidation, which have been formed in Examples, and measuring the X-ray diffraction (XRD) patterns of the respective samples.
Figure 3:
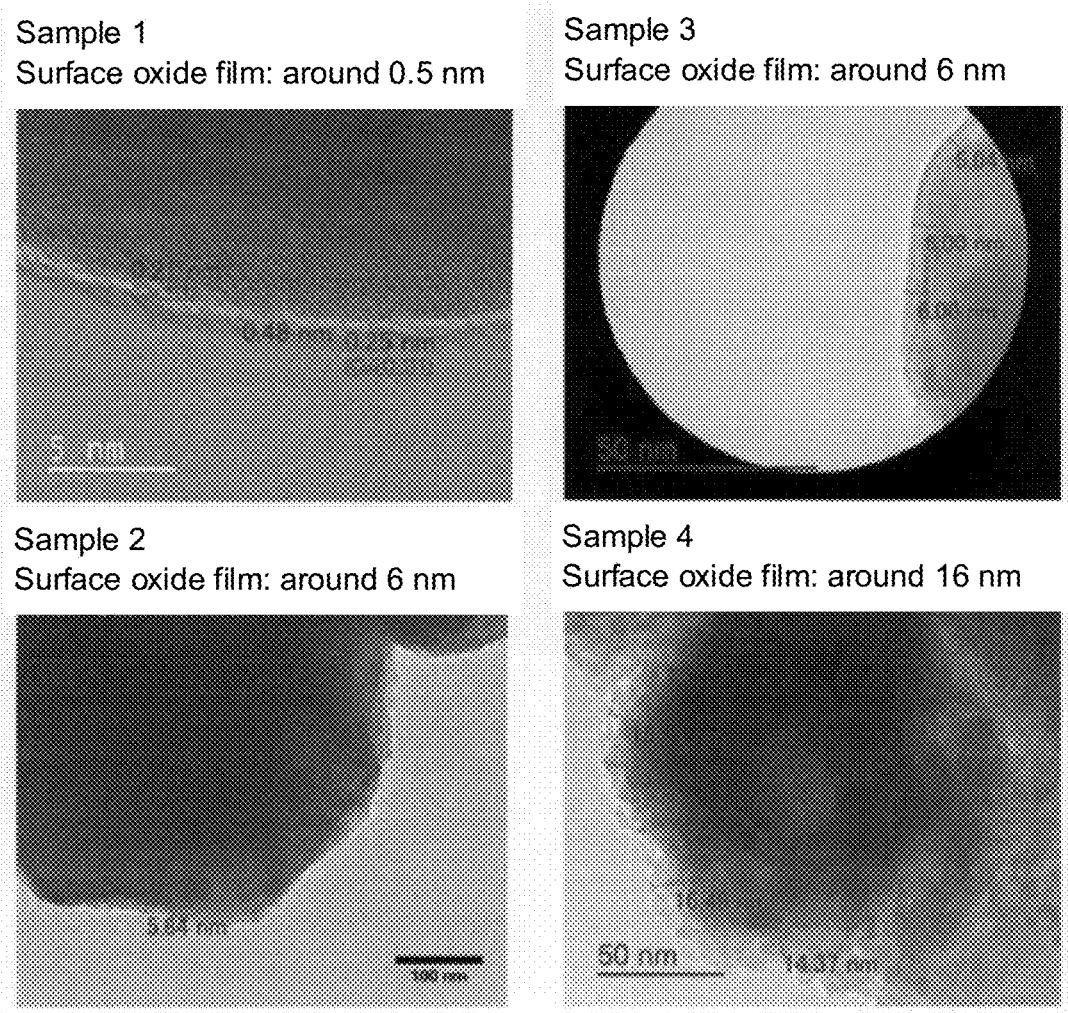
FIG. 3 is a set of photographs showing the results obtained by performing sintering experiments on respective samples having different degrees of the surface oxidation formed in Examples, and measuring the thickness of each oxide layer of the respective samples by transmission electron microscope (TEM) images.

The obtained powder showed extremely high hydrophobicity (FIG. 1), and it was confirmed that the copper particle was covered with caproic acid. The median particle diameter of the caproic acid-coated copper particles was capable of being controlled in the range of 70 to 360 nm, depending on the amount of the caproic acid to be added and the particle diameter of the raw material copper oxide. In the present Example, as to the surface of the copper particle, six samples having different degrees of the surface oxidation were formed, by a simple technique of natural oxidation due to exposure to or flow of air or oxygen, air heating, or the like, and the following firing experiment was performed. The mass fraction of $Cu_2O$ in each sample was calculated by using a reference intensity ratio (RIR) method from the XRD patterns of $Cu_2O$ and $Cu$ shown in FIG. 2. Further, the thickness of the oxidized film was measured from each TEM image shown in FIG. 3.

2. Sintering Experiment

The results obtained by sintering hydrophobic carboxylic acid copper particles having different degrees of the surface oxidation were summarized in Table 1. As to the copper particles, it was able to be confirmed that regardless of the particle diameter, a sample having a mass fraction of $Cu_2O$ of 3% by mass or less and a thickness of oxide film of 6 nm or less was sintered, but it was able to be confirmed that a sample having a mass fraction of $Cu_2O$ of 8% by mass or more and a thickness of oxide film of 16 nm, which was excessively oxidized, was not sintered. In addition, it was able to be confirmed that the sintering was possible at 100° C. or less in a firing atmosphere of a high vacuum of 0.01 Pa or less, but was not possible in a firing atmosphere of a low vacuum of 1 Pa or more.

TABLE 1

|  |  | Sample 1 | | Sample 2 | | Sample 3 | | Sample 4 | | Sample 5 | Sample 6 |
|---|---|---|---|---|---|---|---|---|---|---|---|
| Particle diameter | (nm) | 360 | | 360 | | 100 | | 100 | | 100 | 190 |
| Oxide film | XRD (wt %) | N.D. | | 1 | | 3 | | 8 | | 4 | N.D. (more oxidized than Sample 1) |
|  | TEM (nm) | 0.5 nm | | 6 nm | | 6 nm | | 16 nm | | — | — |
| Vacuum degree of firing | (Pa) | 500 | $3 \times 10^{-6}$ | 500 | $3 \times 10^{-6}$ | 10 | $4 \times 10^{-6}$ | 10 | $4 \times 10^{-6}$ | 1 | $5 \times 10^{-3}$ |
| Firing temperature | (° C.) | | | | | | | 100 | | | |
| Sintering state | | Not sintered | Sintered | Not sintered | Sintered | Not sintered | Sintered | Not sintered | Not sintered | Not sintered | Sintered |

2-1. Heating Experiment with Heating TEM

A heating filament coil made of platinum alloy was attached to a view point of a sample heating holder, and a sample powder was allowed to adhere to the coil for observation. The heating temperature was adjusted by the applied current value of the coil that was calibrated in advance.

Sample 1 ($Cu_2O$: <1% by Mass, $Cu_2O$ Coated Film of 0.5 nm)

Naturally oxidized caproic acid-coated copper particles having a median particle diameter of 360 nm were used. In this sample, the peak of $Cu_2O$ cannot be detected from the XRD pattern, but it is known from the TEM image that the surface is oxidized by around 0.5 nm. The heating was performed in two standards of an ultrahigh vacuum of $3 \times 10^{-6}$ Pa and an atmosphere adjusted to 500 Pa with 5% hydrogen mixed argon gas.

Figure 4:
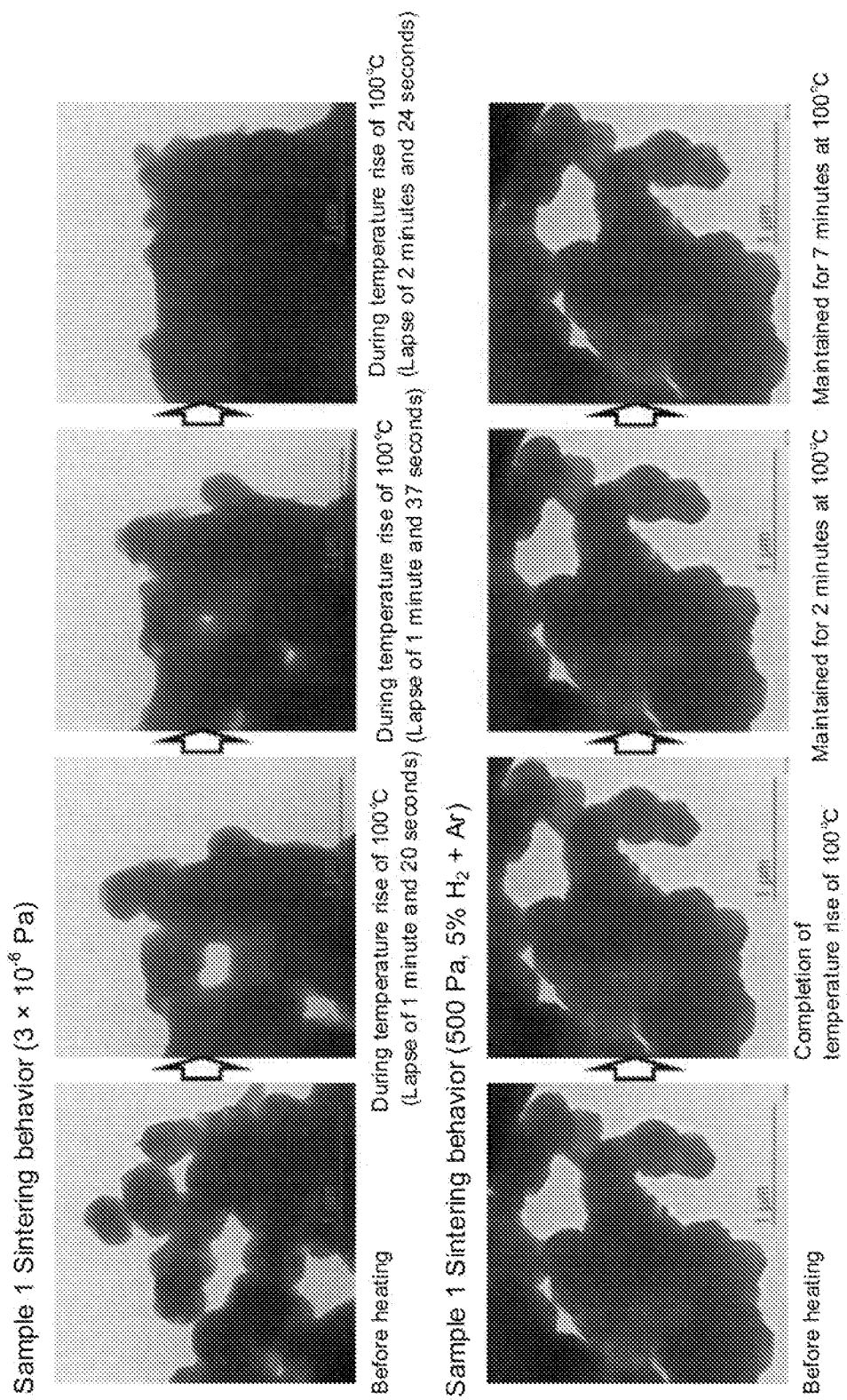
FIG. 4 is a set of photographs showing the results of the heating experiments with a heating TEM, which are performed using Sample 1 ($Cu_2O$: <1 wt %, $Cu_2O$ coated film of 0.5 nm) by heating Sample 1 in two standards of an ultrahigh vacuum of $3\times10^{-6}$ Pa and an atmosphere adjusted to 500 Pa with 5% hydrogen mixed argon gas.

In a high vacuum, the sintering was completed in a few minutes before reaching 100° C., but at 500 Pa, no sintering phenomenon was generated even if the temperature was maintained at 100° C. for 5 minutes or more (FIG. 4).

Sample 2 ($Cu_2O$: 1% by mass, $Cu_2O$ coated film of 6 nm)

By using air-heat oxidized caproic acid-coated copper particles having a median particle diameter of 360 nm, the same heating experiment as that of Sample 1 was performed.

From the XRD pattern, this sample has 1% by mass of $Cu_2O$, and from the TEM image, the surface is oxidized by around 6 nm.

Figure 5:
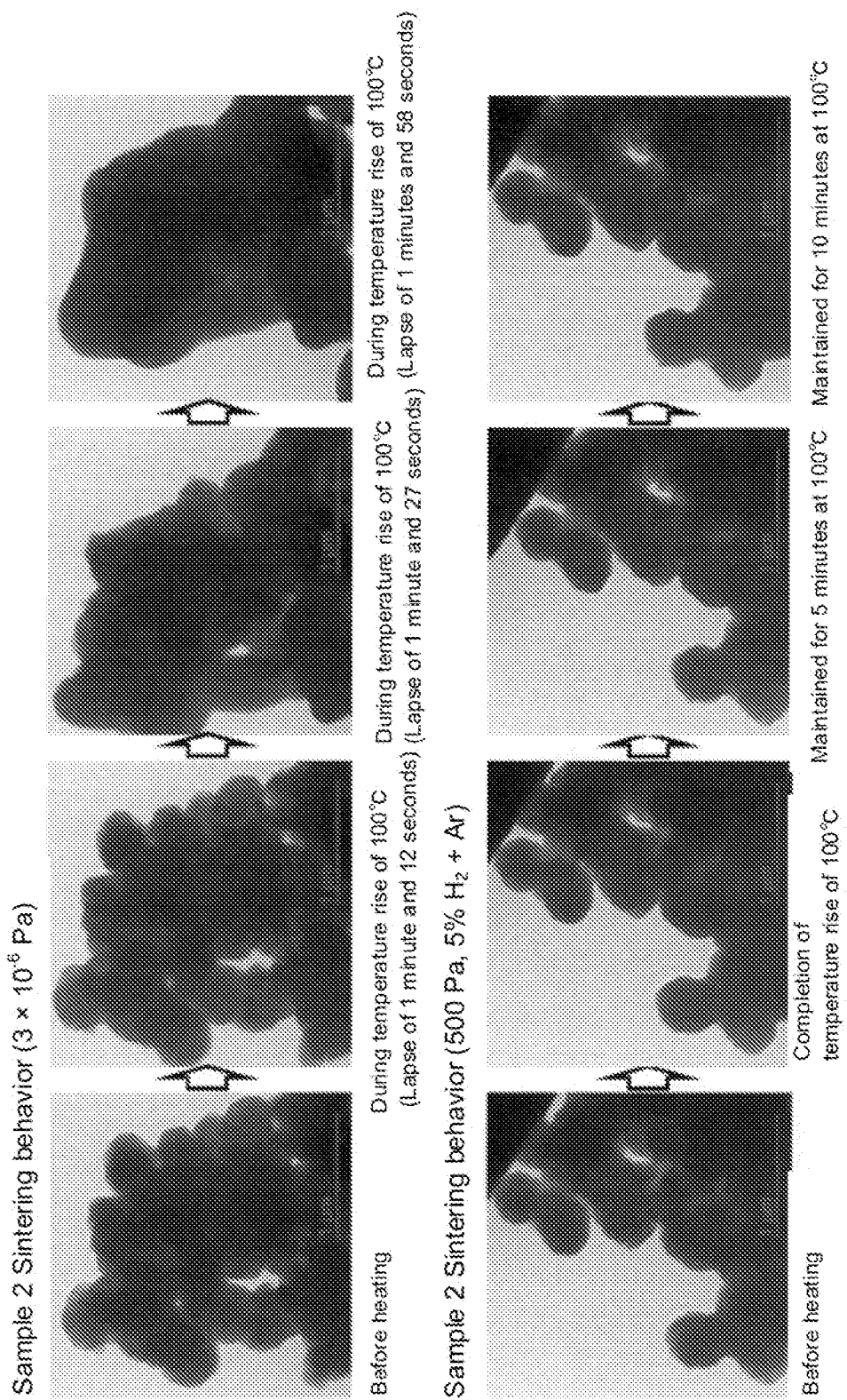
FIG. 5 is a set of photographs showing the results of the heating experiments with a heating TEM, which are performed using Sample 2 ($Cu_2O$: 1 wt %, $Cu_2O$ coated film of 6 nm) by heating Sample 2 in two standards of an ultrahigh vacuum of $3\times10^{-6}$ Pa and an atmosphere adjusted to 500 Pa with 5% hydrogen mixed argon gas.

In an ultrahigh vacuum of $3 \times 10^{-6}$ Pa, sintering was completed in a few minutes before reaching 100° C., but at 500 Pa, no sintering phenomenon was generated even if the temperature was maintained at 100° C. for 5 minutes or more (FIG. 5).

Sample 3 ($Cu_2O$: 3% by Mass, $Cu_2O$ Coated Film of 6 nm)

Figure 6:
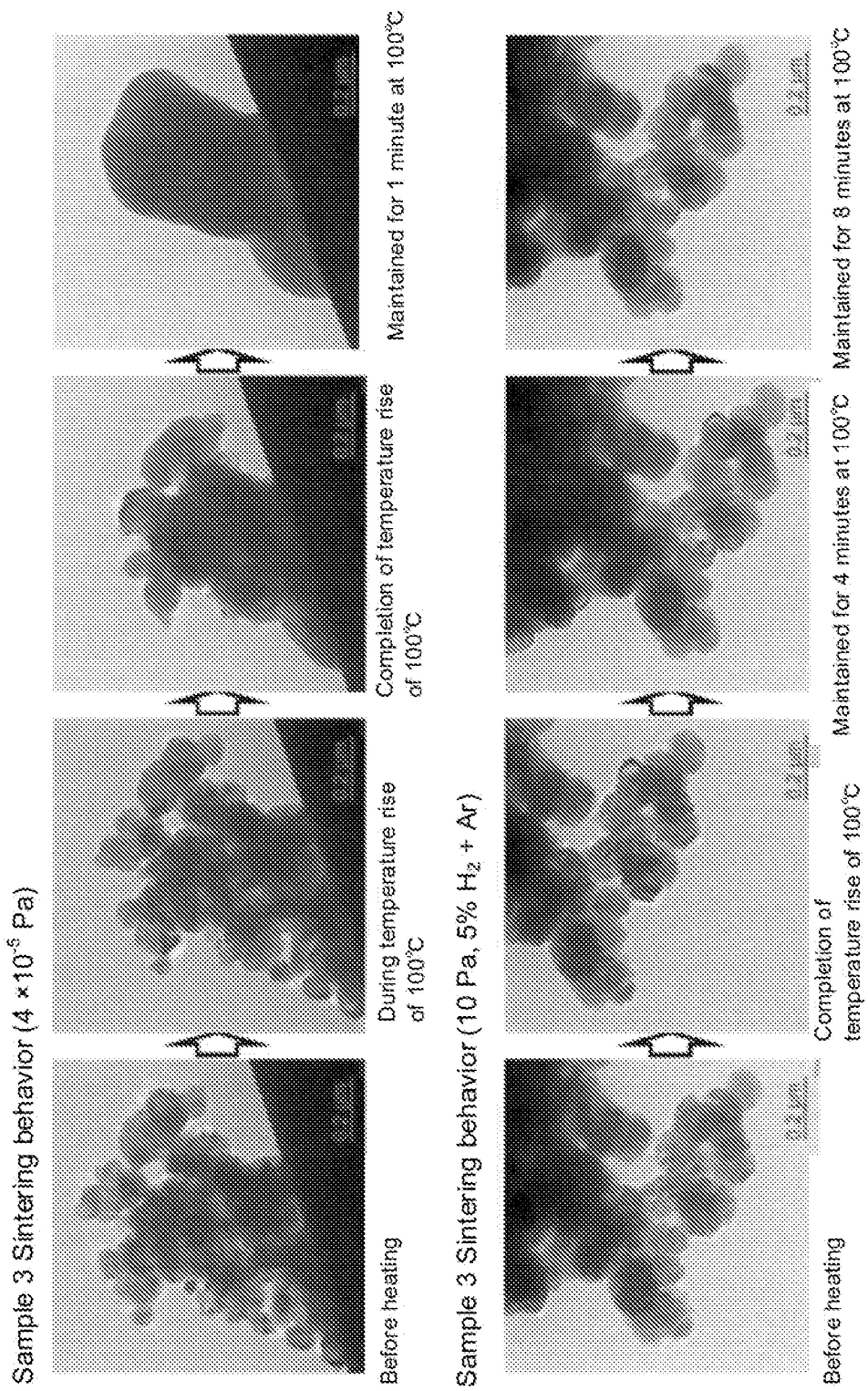
FIG. 6 is a set of photographs showing the results of the heating experiments with a heating TEM, which are performed using Sample 3 ($Cu_2O$: 3 wt %, $Cu_2O$ coated film of 6 nm) by heating Sample 3 in two standards of a high vacuum of $4\times10^{-5}$ Pa and an atmosphere adjusted to 10 Pa with 5% hydrogen mixed argon gas.

Naturally oxidized caproic acid-coated copper particles having a median particle diameter of 100 nm were used. From the XRD pattern, this sample has 3% by mass of $Cu_2O$, and from the TEM image, the surface is oxidized by around 6 nm. The heating was performed in two standards of a high vacuum of $4 \times 10^{-5}$ Pa and an atmosphere adjusted to 10 Pa with 5% hydrogen mixed argon gas. In a high vacuum, the surface that had been rough due to the $Cu_2O$ coating became smooth during temperature rise of 100° C., after that, when the temperature reached 100° C., the sintering was completed in less than one minute. On the other hand, at 10 Pa, no sintering phenomenon was generated even if the temperature was maintained at 100° C. for 8 minutes or more (FIG. 6).

Sample 4 ($Cu_2O$: 8% by Mass, Coated with 16 nm Film of $Cu_2O$)

Figure 7:
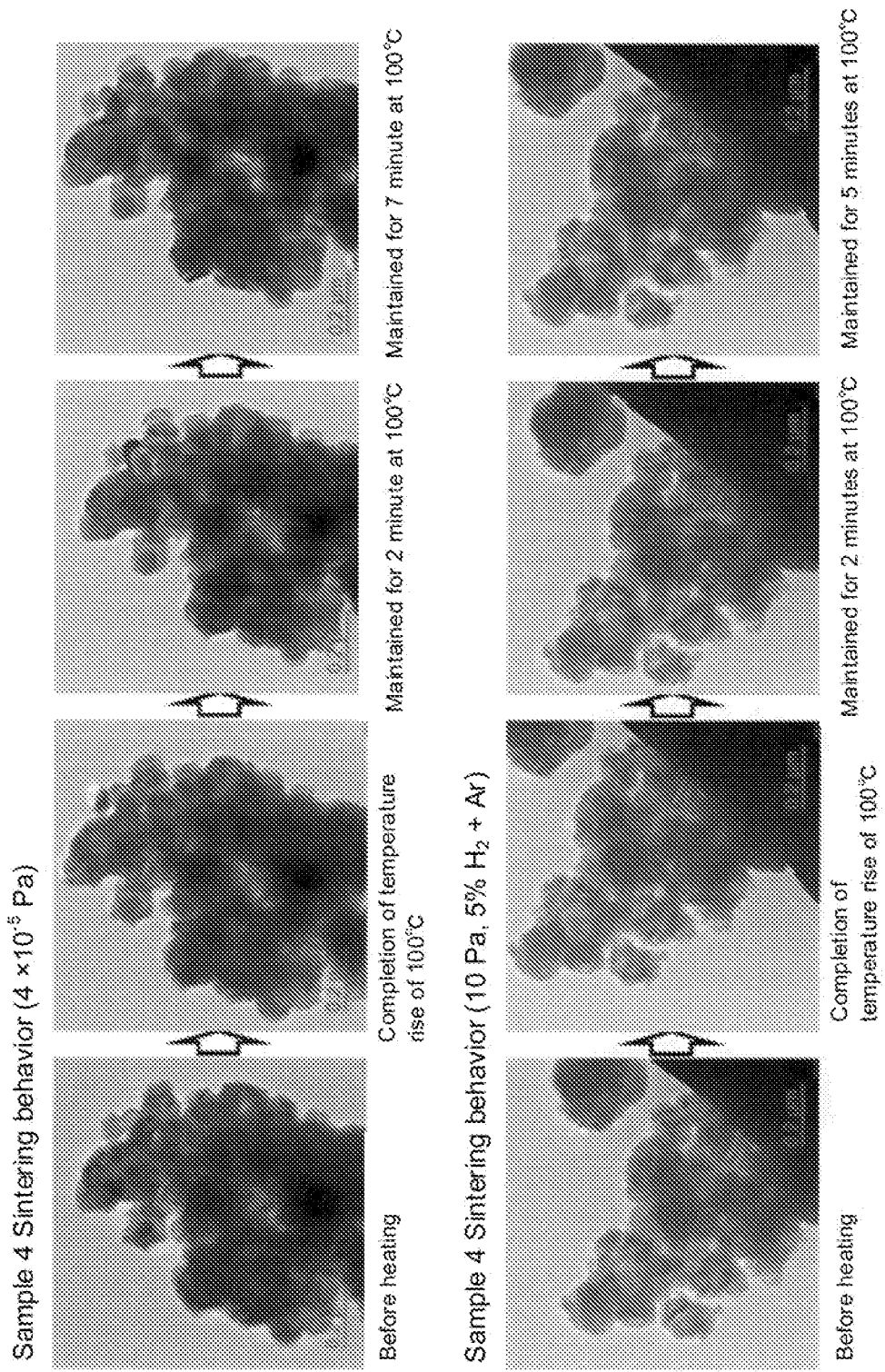
FIG. 7 is a set of photographs showing the results of the heating experiments with a heating TEM, which are performed using Sample 4 ($Cu_2O$: 8 wt %, $Cu_2O$ coated film of 16 nm) by heating Sample 4 in two standards of a high vacuum of $4\times10^{-5}$ Pa and an atmosphere adjusted to 10 Pa with 5% hydrogen mixed argon gas.

By using air-heated oxidized caproic acid-coated copper particles having a median particle diameter of 100 nm, the same experiment as that of Sample 3 was performed. From the XRD pattern, this sample has 8% by mass of $Cu_2O$, and from the TEM image, the surface is oxidized by around 16 nm. In a high vacuum, it can be confirmed that the surface that had been rough due to the $Cu_2O$ coating became smooth by maintaining the temperature at 100° C. However, no sintering phenomenon was generated even if the temperature was maintained for 7 minutes. Further, also at 10 Pa, no sintering phenomenon was generated even if the temperature was maintained at 100° C. for 5 minutes (FIG. 7).

2-2. Heating Experiment in Vacuum (Low Vacuum) Sample 5

Figure 8:
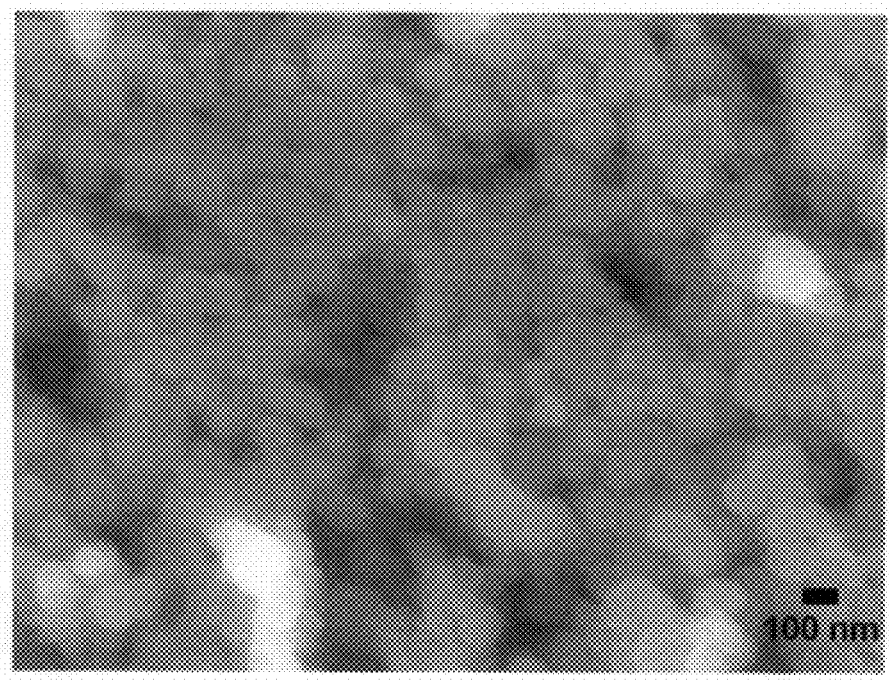
FIG. 8 is a scanning electron microscope (SEM) photograph obtained using Sample 5 ($Cu_2O$: 4 wt %) by heating Sample 5 at a vacuum degree of around 1 Pa for 18 hours in an oil bath at 100° C. and then cooling heated Sample 5 to room temperature, and analyzing cooled Sample 5.

A dispersion after purification at the time of forming the caproic acid-coated copper particles having a median particle diameter of 100 nm was transferred into a 100 mL flask, the evacuation was performed with a rotary pump, and the heating was performed at a vacuum degree of around 1 Pa for 18 hours in an oil bath at 100° C. After the heating was completed, the resultant mixture was cooled to room temperature, and then analyzed. From the XRD pattern, the sample was oxidized to have up to 4 wt % of $Cu_2O$ with the low vacuum condition. After the heating, a glossy copper foil was formed on a wall surface of the flask, but it was confirmed from the SEM observation image that the copper foil was not sintered (FIG. 8).

2-3. Heating Experiment in Vacuum (High Vacuum) Sample 6

Figure 9:
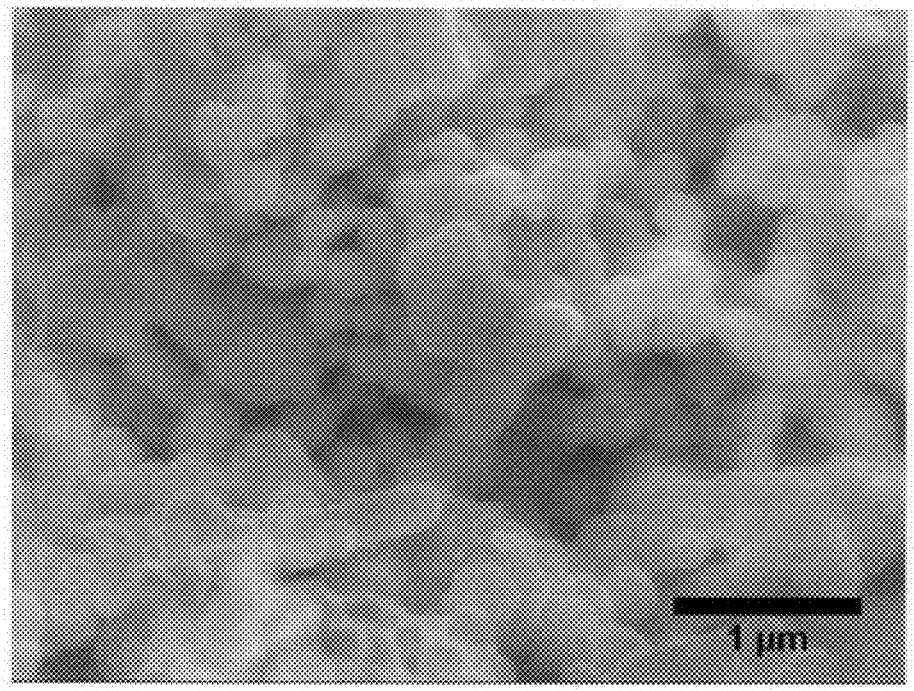
FIG. 9 is a SEM photograph of the particles after heating, which are obtained using Sample 6 ($Cu_2O$: 4 wt %) by heating Sample 6 at 100° C. for one hour in a vacuum of $5\times10^{-3}$ Pa or less.
Figure 10:
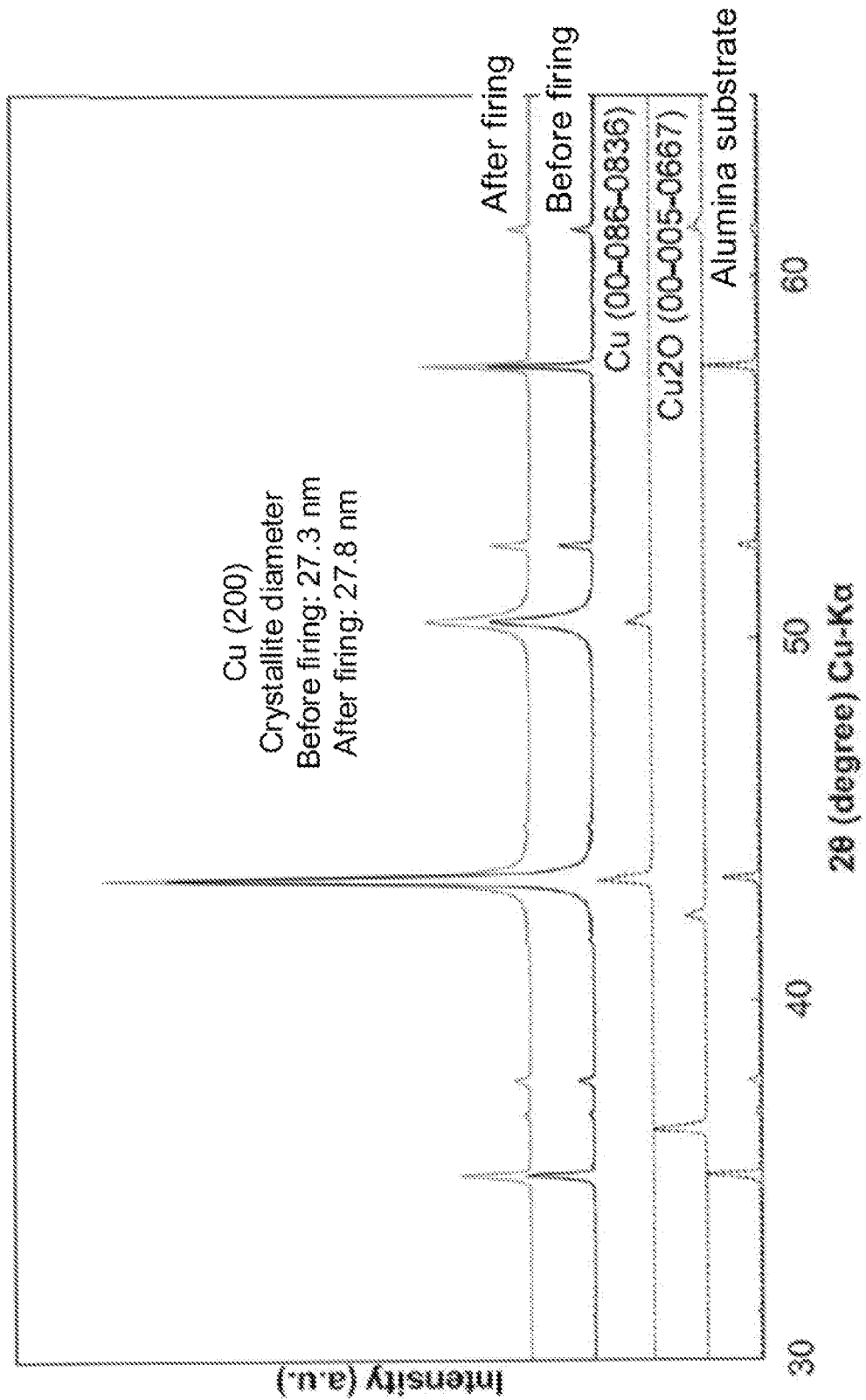
FIG. 10 is a chart showing the results obtained by heating Sample 6 ($Cu_2O$: 4 wt %) at 100° C. for one hour in a vacuum of $5\times10^{-3}$ Pa or less and measuring the XRD patterns.

A vacuum sintering furnace was made by attaching a vacuum chamber to a turbo molecular pump exhaust system (Hi Cube 80 Eco manufactured by Hakuto Co., Ltd). The heater for heating was self-made by sandwiching a ceramic heater of 89 W/cm² between copper plates. A thermocouple was arranged on the copper plates to monitor the heating temperature. As the firing sample, caproic acid-coated copper particles having a median particle diameter of 190 nm were used. As to the particles, an extremely slight peak of $Cu_2O$ can be confirmed although the quantification cannot be determined from the XRD pattern. The powder of the particles was rubbed and fixed onto an alumina substrate, and the substrate was fixed on a heater with a heat-resistant double-sided copper tape. In this state, the heating was performed at 100° C. for one hour in a vacuum of $5 \times 10^{-3}$ Pa or less. In the particles after the heating, necking accompanying the sintering was observed from the SEM image (FIG. 9). Further, as the phenomenon supporting the progress of the sintering, when comparing the peaks of Cu (200) between before and after the firing shown in the XRD patterns, the peak after the firing was slightly sharper, and it was confirmed that the crystallite diameter calculated by the Scherrer equation became larger by the firing (FIG. 10).

The invention claimed is:

1. Low-temperature sinterable copper particles, wherein each copper particle is coated with a carboxylic acid, and a surface of the copper particle is oxidized so as to have a cuprous oxide fraction ($Cu_2O/(Cu+Cu_2O)$) in the copper particle of 1 to 4% by mass or so as to have an average coating thickness of cuprous oxide of 0.3 to 10 nm.

2. The low-temperature sinterable copper particles according to claim 1, wherein
the carboxylic acid is at least one kind selected from an aliphatic monocarboxylic acid, an aliphatic dicarboxylic acid, an aromatic carboxylic acid, and a terpene-based carboxylic acid.

3. The low-temperature sinterable copper particles according to claim 1, wherein
the carboxylic acid is at least one kind selected from an aliphatic monocarboxylic acid having 5 or more carbon atoms, and an aliphatic dicarboxylic acid having 6 or more carbon atoms.

4. The low-temperature sinterable copper particles according to claim 1, wherein
the low-temperature sinterable copper particles are effective to perform low-temperature firing in an atmosphere of 0.01 Pa or less.

5. The low-temperature sinterable copper particles according to claim 4, wherein
a temperature of the low-temperature firing is 150° C. or less.

6. The low-temperature sinterable copper particles according to claim 4 wherein
a temperature of the low-temperature firing is 100° C. or less.

7. A method for producing a copper particle sintered body, comprising
performing low-temperature firing on the low-temperature sinterable copper particles according to claim 1 in an atmosphere of 0.01 Pa or less.

8. The method for producing a copper particle sintered body according to claim 7, wherein
a temperature of the low-temperature firing is 150° C. or less.

9. The method for producing a copper particle sintered body according to claim 7, wherein
a temperature of the low-temperature firing is 100° C. or less.

* * * * *